United States Patent [19]

Birt et al.

[11] 4,257,123
[45] Mar. 17, 1981

[54] DEVICE FOR MONITORING THE PERFORMANCE OF A TRANSMITTER

[75] Inventors: David R. Birt, Charlwood; John A. Brandhuber, Brighton, both of England

[73] Assignee: Communications Patents Limited, London, England

[21] Appl. No.: 32,953

[22] Filed: Apr. 24, 1979

[30] Foreign Application Priority Data

Apr. 27, 1978 [GB] United Kingdom ............. 16673/78

[51] Int. Cl.³ ............................................. H04B 17/00
[52] U.S. Cl. ..................................... 455/115; 455/67; 455/117; 324/142
[58] Field of Search ............. 325/133, 134, 150, 168, 325/178, 67, 363, 398; 324/58 A, 110, 58 B, 103 R, 103 P, 98, 142; 358/10; 455/115, 117, 217, 67, 226, 232

[56] References Cited

U.S. PATENT DOCUMENTS

| | | | |
|---|---|---|---|
| 3,919,643 | 11/1975 | Templin | 325/150 |
| 4,023,104 | 5/1977 | Rheinfelder | 325/133 |
| 4,048,564 | 9/1977 | Gleeson, Jr. | 325/133 |
| 4,072,900 | 2/1978 | Ray | 325/133 |
| 4,096,441 | 6/1978 | Schwartz | 325/133 |

FOREIGN PATENT DOCUMENTS 2724258 9/1978 Fed. Rep. of Germany ............ 325/150

OTHER PUBLICATIONS

DC Measurement Circuit, The Radio Amateur's Handbook, pp. 528–529, 1971.
An In-Line RF Wattmeter, The Radio Amateur's Handbook, pp. 554–555, 1971.
The Operational Amplifier, Engineering Electronics, by Ryder, McGraw-Hill Book Company, Inc., 1957, pp. 226–231.

*Primary Examiner*—Howard W. Britton
*Assistant Examiner*—Tommy P. Chin
*Attorney, Agent, or Firm*—Laurence R. Brown

[57] ABSTRACT

A device for monitoring the performance of a transmitter, comprising a first input connected to receive a signal representative of transmitter output current, a second input connected to receive a signal representative of transmitter output voltage, a multiplier, a comparator connected to the output of the multiplier, and a switch controllable either to connect the first and second inputs to the multiplier such that the multiplier output is representative of the transmitter output power, or to connect one of the two inputs to the multiplier and the other to the comparator and to connect the comparator output to the multiplier such that the comparator remains in balance and the comparator output is representative of the transmitter output impedance. The first input may be connected directly to the multiplier and the second input can be selectively connected to either the multiplier or the comparator by the switching means.

5 Claims, 6 Drawing Figures

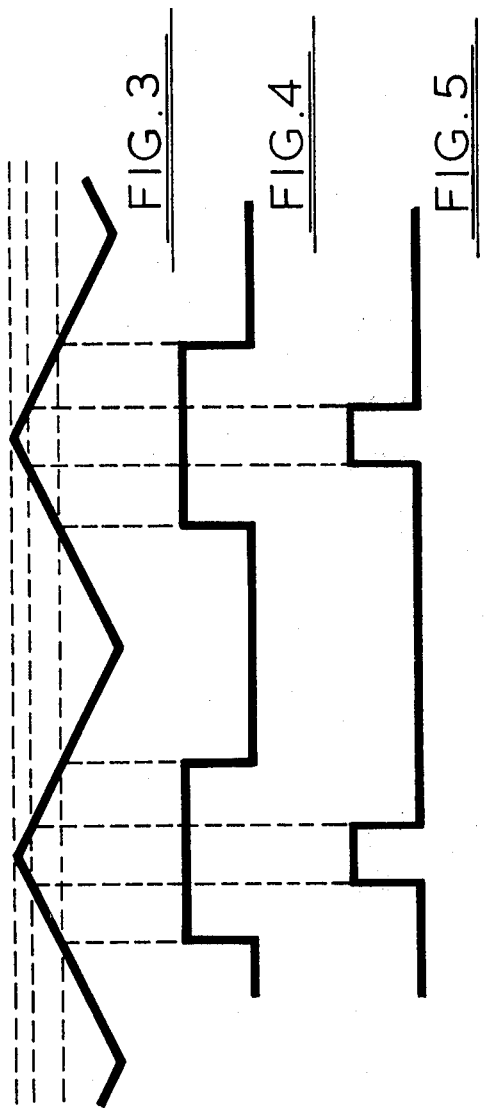

DEVICE FOR MONITORING THE PERFORMANCE OF A TRANSMITTER

The present invention relates to a device for monitoring the performance of a transmitter.

It is known that the output of an RF transmitter can be monitored by determining the output power, the output impedance, and the relative phase of the output current and the output voltage. The output power can be derived by multiplying signals representative of the output current and output voltage, and the output impedance can be derived by dividing the output voltage by the output current. Conventionally separate test devices have been provided for determining each of the three transmitter conditions.

According to the present invention, there is provided a device for monitoring the performance of a transmitter, comprising a first input for receiving a signal representative of transmitter output current, a second input for receiving a signal representative of transmitter output voltage, a multiplier, a comparator connected to the output of the multiplier, and switching means controllable either to connect the first and second inputs to the multiplier such that the multiplier output is representative of the transmitter output power, or to connect the two inputs one to the multiplier and the other to the comparator and to connect the comparator output to the multiplier such that the comparator remains in balance and the comparator output is representative of the transmitter output impedance.

Preferably the first input is connected directly to the multiplier and the second input can be selectively connected to either the multiplier or the comparator by the switching means.

The multiplier may comprise a self oscillating triangular wave generator, a further comparator for comparing the output of the triangular wave generator with the signal appearing at the first input, a transistor controlled by the output of the further comparator to gate the signal provided to the multiplier by the switching means, and an integrator connected to the transistor output.

Advantageously the switching means are controllable to connect the first and second inputs to a phase detector the output of which is representative of the relative phase of the transmitter output current and the transmitter output voltage.

An embodiment of the invention will now be described, by way of example, with reference to the accompanying drawings, in which:

FIGS. 3, 4 and 5 illustrate waveforms appearing in the circuitry of FIGS. 1 and 2.

Figure 1:
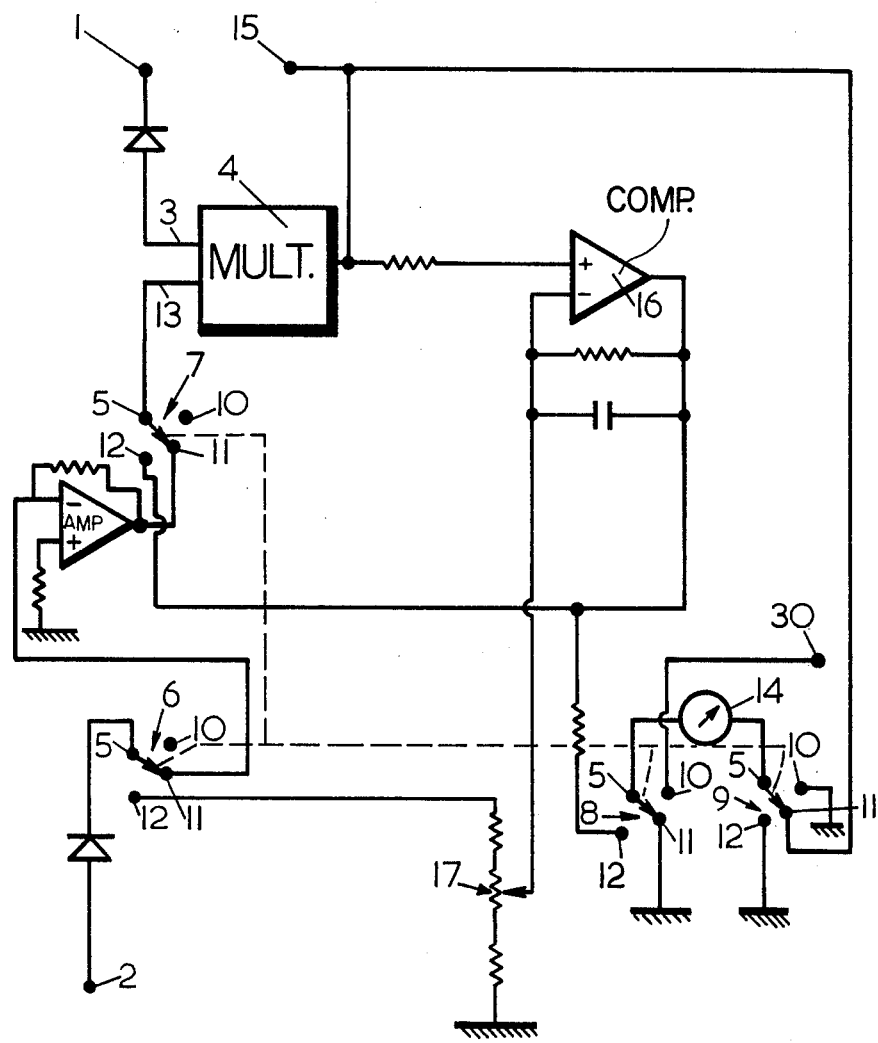
FIG. 1 is a part-schematic diagram of multiplier and divider circuitry in an embodiment of the present invention.

Referring to FIG. 1, signals proportional in amplitude to the R.F. output current and output voltage of a transmitter (not shown) are applied to input terminals 1 and 2 respectively. These inputs are rectified such that a DC voltage proportional to output current is applied to an input 3 of a multiplier 4 and a DC voltage proportional to output voltage is applied to terminal 5 of a switch 6. Four switches 6, 7, 8 and 9 are ganged together, each switch comprising terminals 5, 10, 11 and 12. The terminal 5 of switch 7 is connected to a second input 13 to the multiplier 4. A meter 14 is connected between terminals 5 of switches 8 and 9.

The transmitter output power, which is equal to the product of output current and output voltage, is measured by placing the switches 6, 7, 8 and 9 in the position shown with terminals 5 and 11 connected. The signals appearing at the inputs 3 and 13 of multiplier 4 are respectively proportional to transmitter output current and voltage respectively, and thus the output of the multiplier, which appears at terminal 15, is proportional to transmitter output power. The output signal at terminal 15 may be read from meter 14. Also the terminal 15 may be connected to an automatic level control circuit (not shown) arranged to maintain the transmitter output power within desired limits.

The transmitter output impedance, which is equal to output voltage divided by output current, is measured by placing the switches 6, 7, 8 and 9 in the positions in which terminals 5 and 12 are connected. The input 3 to the multiplier 4 is still proportional to transmitter output current, and the signal at terminal 15 is still proportional to the product of inputs 3 and 13. The input 13 is however now derived from a comparator 16, to form a closed loop control system the damping factor of which is determined primarily by the time constant of the comparator 16 as defined by the parallel resistor and capacitor combination connected between its output terminal and inverting input terminal. If it is arranged that the signal at terminal 15 is proportional to transmitter output voltage, the signal of input 13 must be proportional to the transmitter output impedance because of the interrelationship between the signals at the terminals of the multiplier 4. These conditions are obtained by applying a signal proportional to transmitter output voltage from input 2 to the inverting input of the comparator 16 via switch 6 and a scaling potential divider 17. The output of multiplier 4 is applied to the non-inverting input of the comparator 16.

If the signal at the non-inverting input swings above the signal at the inverting input, the output of the comparator 16 swings negative. Thus the input 13 to the multiplier also swings negative and the comparator is brought into balance. If the signal at the non-inverting input swings below the signal at the inverting input, the comparator is again brought into balance. The system is thus stable, operating with negative feedback. The transmitter output impedance can be read from meter 14.

Figure 2:
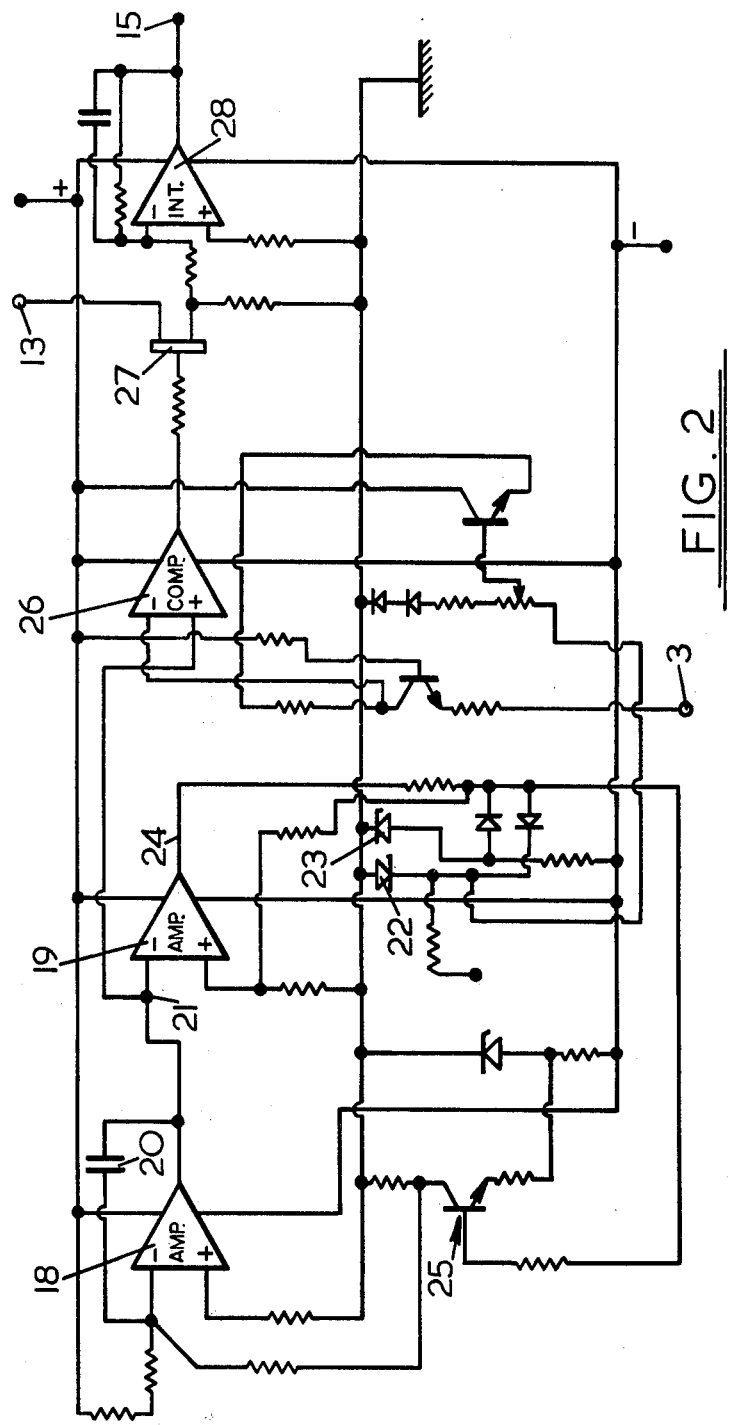
FIG. 2 shows details of a multiplier circuit illustrated schematically in FIG. 1.

Referring now to FIG. 2, details of the circuit of the multiplier 4 of FIG. 1 are shown, terminals 3, 13 and 15 in FIGS. 1 and 2 corresponding. The multiplier comprises a triangular wave generator formed by two operational amplifiers 18, 19, a capacitor 20 integrating to output of amplifier 18 to provide linear rises and falls at point 21 and zener diodes 22, 23 operating to provide a ramp height limit. Feedback is applied from the output 24 of amplifier 19 via a transistor stage 25 to the input of amplifier 18 to produce a self oscillating system. The waveform appearing at point 21 is shown in FIG. 3.

The waveform appearing at point 21 is compared with the signal representative of transmitter output current appearing at terminal 3 by a comparator 26. The signal at terminal 3 is negative going. When the signal at terminal 3 is at maximum amplitude, the output of comparator 26 is a pulse train with a 50/50 mark/space ratio. When the signal at terminal 3 is zero, no pulses appear at the output of comparator 26.

The output of comparator 26 is thus a width modulated pulse train the width of the pulses being proportional to transmitter output current. FIG. 4 shows the output of the comparator when the signal at terminal 3 is zero, and FIG. 5 shows the output when the signal at terminal 3 is at a level intermediate zero and its maximum.

The output of comparator 26 is applied to the gate of an "N" channel field effect transistor 27. Assuming that the multiplier is operating in the circuit as shown in FIG. 1, the signal representative of transmitter output voltage appearing at terminal 13 is gated through the transistor 27 to a long time constant operational integrator 28. The signal at terminal 15 is thus the integral of a series of pulses, the width of each pulse being proportional to transmitter output current and the height of each pulse being proportional to transmitter output voltage. The signal at terminal 15 is thus proportional to transmitter output power.

Figure 6:
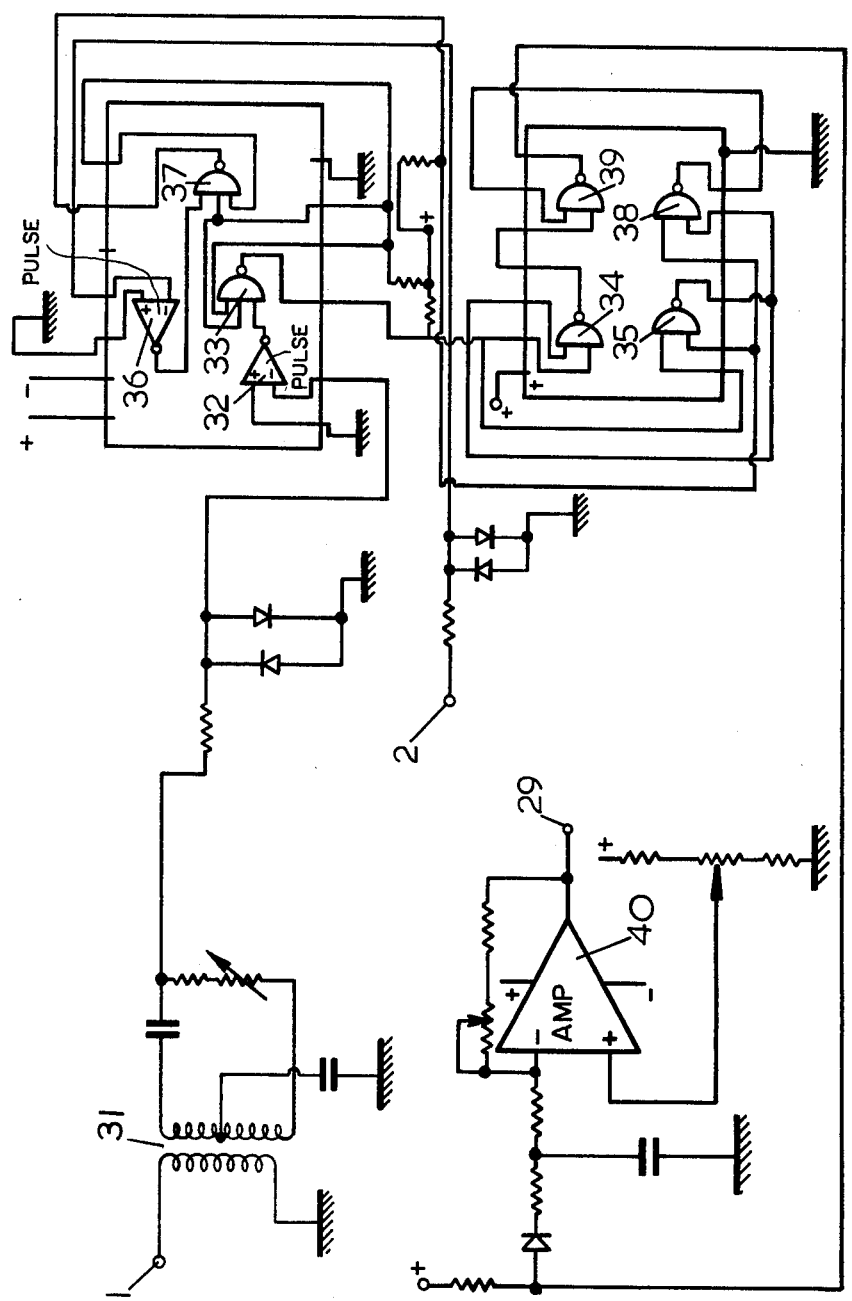
FIG. 6 is a diagram of phase detection circuitry.

Referring now to FIG. 6, the logic circuitry of a phase detector is shown. The phase detector comprises inputs 1 and 2 which correspond to inputs 1 and 2 of FIG. 1, and an output 29 which is connected via terminal 30 to terminal 10 of switch 8 in FIG. 1. The AC current sample signal is passed from input 1 via a transformer 31 (FIG. 6) to a pulse forming circuit 32 the output of which is passed via a NAND gate 33 to NAND gates 34 and 35. The AC voltage sample is passed from input 2 to a pulse forming circuit 36 the output of which is passed via a NAND gate 37 to NAND gates 38 and 35. The output of gate 35 is applied to gates 34 and 38, and the outputs of gates 34 and 38 are applied to NAND gate 39.

If the current and voltage samples are in phase, the gate 35 receives pulse trains which are exactly in phase and its output is therefore the inverse of either of its inputs. Thus the outputs of gates 34 and 38 continuously at logic "1" and the output of gate 39 is continuously at logic "0". If the current and voltage samples are out of phase, the outputs of gates 34 and 38 periodically drop to logic "0" as one of the inputs of these gates is no longer the inverse of the other. Each time this happens a "1" pulse appears at the output of gate 39, the width of the pulse being proportional to the phase difference. A voltage proportional to the width of the pulses provided by gate 39 is applied by operational amplifier 40 to the output 29.

Referring again to FIG. 1, with the switches 6, 7, 8 and 9 positioned to connect terminals 5 and 10, the phase representative signal at terminal 30 is applied via switches 8 and 9 to the meter 14.

Thus by simply operating the four ganged switches 6, 7, 8 and 9 direct readings of transmitter output power, output impedance and the relative phase therebetween can be obtained.

It will be appreciated that the switches 6, 7, 8 and 9 may be mechanical or solid state and may be remotely controllable if desired.

Automatic aerial tuning may be achieved in conventional manner using the signals representative of transmitter performance made available by the described apparatus.

What is claimed is:

1. A device for monitoring the performance of a transmitter, comprising a first input for receiving a signal representative to transmitter output current, a second input for receiving a signal representative of transmitter output voltage, a multiplier, a comparator connected to the output of the multiplier, and switching means controllable either to connect the first and second inputs to the multiplier such that the multiplier output is representative of the transmitter output power, or to connect one of the two inputs to the multiplier and the other to the comparator and to connect the comparator output to the multiplier such that the comparator remains in balance and the comparator output is representative of the transmitter output impedance.

2. A device according to claim 1, wherein the first input is connected directly to the multiplier and the second input can be selectively connected to either the multiplier or the comparator by the switching means.

3. A device according to claim 2, wherein the multiplier comprises a self oscillating triangular wave generator, a further comparator for comparing the output of the triangular wave generator with the signal appearing at the first input, a transistor controlled by the output of the further comparator to gate the signal provided to the multiplier by the switching means, and an integrator connected to the transistor output.

4. A device according to claim 1, wherein the switching means are controllable to connect the first and second inputs to a phase detector the output of which is representative of the relative phase of the transmitter output current and the transmitter output voltage.

5. A device according to claim 4, wherein the phase detector comprises a logic circuit including first, second, third and fourth NAND gates, said first NAND gate receiving first and second pulse trains in phase with the transmitter current and voltage outputs, said second and third NAND gates receiving the output of the first gate and respective ones of the first and second pulse trains, and said fourth NAND gate receiving the outputs of said second and third NAND gates, said fourth NAND gate providing output pulses the widths of which are proportional to the phase difference between the first and second pulse trains.

* * * * *